United States Patent [19]
Deam et al.

[11] Patent Number: 5,365,424
[45] Date of Patent: *Nov. 15, 1994

[54] HIGH POWER LAMINATED BUS ASSEMBLY FOR AN ELECTRICAL SWITCHING CONVERTER

[75] Inventors: David Deam, San Ramon; William L. Erdman, Brentwood, both of Calif.

[73] Assignee: Kenetech Windpower, Inc., Livermore, Calif.

[*] Notice: The portion of the term of this patent subsequent to Dec. 15, 2009 has been disclaimed.

[21] Appl. No.: 990,681

[22] Filed: Dec. 15, 1992

Related U.S. Application Data

[63] Continuation-in-part of Ser. No. 728,112, Jul. 10, 1991, Pat. No. 5,172,310.

[51] Int. Cl.⁵ .......................... H02M 1/10; H01B 5/00
[52] U.S. Cl. ................................. 363/144; 363/132; 361/637; 307/148; 174/72 B
[58] Field of Search ................. 363/56, 132, 137, 141, 363/144; 361/355, 341, 361; 307/58, 147, 148; 174/72 B, 68.2, 99 B, 129 B, 133 B

[56] References Cited

U.S. PATENT DOCUMENTS

| | | | |
|---|---|---|---|
| 3,895,285 | 7/1975 | Bardahl et al. | 363/144 |
| 4,224,663 | 9/1981 | Maiese et al. | 363/144 |
| 4,346,257 | 8/1982 | Moss et al. | 174/72 B |
| 5,132,896 | 7/1992 | Nishizawa et al. | 363/144 |
| 5,172,310 | 12/1992 | Deam et al. | 363/144 |
| 5,187,427 | 2/1993 | Erdman | 323/207 |

OTHER PUBLICATIONS

Intellimod TM : Technical Data Book for Intelligent Power Modules, *Powerex, Inc., Hillis Street, Youngwood, Pa.*, 1992, pp. 3–xiv to 3–xv.

McNerney et al., "The Effect of a Power Electronic Converter on Power Fluctuation and Harmonic Distortion in a WECS", ASME Wind Energy Symposium, New Orleans, Jan. 1990.

Matsuzaka et al., "A Variable Speed Wind Generating System and its Test Results, Hachinohe Institute of Technology", Tohoku Electric Power Company, Japan.

Ott, Henry W., "Noise Reduction Techniques in Electronic Systems", 2nd Edition, John Wiley & Sons (1988) pp. 124–126.

Rashid, Muhammad H., *Power Electronics*, Chapter 8, "Inverters", pp. 226–248.

*Primary Examiner*—Steven L. Stephan
*Assistant Examiner*—Adolf Berhane
*Attorney, Agent, or Firm*—Blakely, Sokoloff, Taylor & Zafman

[57] ABSTRACT

A low impedance, low noise laminated bus assembly for a high power switched converter that has a plurality of switch pairs including a −DC switch and a +DC switch for high speed switching to convert between an AC power line and a DC power storage device such as capacitors. The laminated bus assembly includes a first conductor plane having a plurality of AC bar conductors for each phase of AC power, a second conductor plane including a −DC bar conductor, and a third conductor plane including a +DC bar conductor. A dielectric layer is laminated between the first, second, and third planes. The circuit layout includes a plurality of electrical connections between the switches, the AC, −DC and +DC bar conductors, and the DC power storage device. Some of the electrical connections require that a coupling conductor pass through another bar conductor, which must therefore be insulated from the coupling conductor. Each bar conductor therefore has at least one insulated hole that includes an annular insulator through which the coupling conductor, which is a bushing, is inserted.

4 Claims, 6 Drawing Sheets

FIG_1B

FIG_3

FIG_4

FIG_5

HIGH POWER LAMINATED BUS ASSEMBLY FOR AN ELECTRICAL SWITCHING CONVERTER

This is a continuation-in-part of copending U.S. patent application Ser. No. 07/728,112 now U.S. Pat. No. 5,172,310, "Low Impedance Bus for Power Electronics", by Deam, et al., filed Jul. 10, 1991, which is incorporated by reference herein.

BACKGROUND OF THE INVENTION

1. Field of the Invention

The present invention relates to high power bus assemblies for converters with high speed switches that are modulated to convert electrical power from AC to DC, or from DC to AC.

2. Description of Related Art

There are many instances in which conversion between AC electrical energy and DC electrical energy can be useful. For example, U.S. Pat. No. 5,083,039 to Richardson, et al., describes a variable speed wind turbine that utilizes a converter to convert the generated variable frequency AC power to DC power. A second converter then converts this DC power back to AC power, but at a fixed frequency that is compatible with the power grid. The converters described therein are switching converters controlled by pulse width modulation techniques to provide a current-controlled waveform or a voltage-controlled waveform if desired.

A switching converter includes a plurality of high speed switches that are quickly modulated to produce a predetermined waveform. Higher switching speeds allow greater control of the predetermined waveform. One limit upon the switching speed of a converter is the impedance of the input and output buses. An inductive impedance substantially attenuates the high frequency response of a bus, slowing effective switching speed, reducing conversion efficiency, and lessening waveform control so that the output waveform is less accurate. Another impedance-related problem is the appearance of voltage transients which can harm semiconductor devices. Voltage transients during high speed switching are caused by inductive impedances in the bus. Therefore, the voltage transients can be lowered by reducing the characteristic impedance of the bus.

The design of a bus in large part determines its impedance. To reduce impedance at high (microwave) frequencies, parallel plate transmission lines have been used extensively. However, outside of high frequency uses, parallel plate transmission lines have not been widely used. The copending patent application, Ser. No. 07/728,112, "Low Impedance Bus for Power Electronics" referenced above discloses use of a parallel plate transmission line in a power electronics environment. The bus configuration disclosed therein is designed to balance current flows for low impedance and low noise. Despite the advantages of that bus configuration, its overall package is costly in terms of space.

For low power electrical circuits, space and cost savings have been realized by using laminated circuits that have a stack of conductive layers alternating with dielectric layers. Such low power laminated circuits are usually manufactured with "prepreg" dielectric layers that, under heat and pressure, conform about the thin conductors. However, for high power applications, laminated circuits are not used. One explanation is difficulty in manufacturing. High power conductors have a large conductive cross-section, which require that the conductors have much greater thicknesses. A conventional prepreg process is not practical for manufacturing with these large thicknesses because the prepreg layer cannot provide enough dielectric to fill in the gaps. Another problem with high power laminated circuits is arcing between closely positioned high voltage conductors. Arcing is a problem when connecting conductors that are in different layers, and particularly when the connection passes through another conductive layer.

It would be an advantage to supply a high power bus with low impedance in a compact, robust package that is mechanically strong and can safely conduct large current at high voltages. Such a bus would allow reliable converter operation with efficiency and accuracy.

SUMMARY OF THE INVENTION

The present invention provides a low impedance bus for a high power switching converter. The low impedance bus includes a laminated bus assembly in a single, mechanically strong package that includes a plurality of closely spaced bar conductors separated by dielectric layers. The low characteristic impedance of the laminated bus assembly allows high switching speeds for the converter, high conversion efficiency, and a highly accurate output waveform. Furthermore, the low characteristic impedance reduces voltage transients caused by fast transitioning currents, providing reliable operation with semiconductor switches having a lower voltage rating than would otherwise be possible.

The laminated bus assembly provides bus connections for a high power converter that converts electrical energy between multi-phase AC and constant voltage DC. The converter includes a DC energy storage device such as a capacitor bank for storing electrical energy at a constant voltage. A switch pair is coupled between each AC phase and the capacitor bank. Each of the switches is of a type for switching high power electrical energy. The converter also includes a switch controller coupled to the switch pairs for controlling the switch pairs to provide a predetermined electrical power flow in direction and amount. The switch controller utilizes pulse width modulation (PWM) techniques to control the instantaneous currents in the switches.

The laminated bus assembly includes a plurality of AC bar conductors, including one for each AC phase. In a 3-phase system, the laminated bus assembly includes a first AC bar conductor, a second AC bar conductor, and a third AC bar conductor. The laminated bus assembly also includes a −DC bar conductor that is coupled through a first −DC coupler to the −DC side of the DC energy storage device, and a first switch coupler that couples the −DC bus with each −DC switch Likewise for +DC, the laminated bus assembly includes a +DC bus that is coupled through a second −DC coupler to the +DC side of the DC energy storage means, and a second switch coupler that couples the +DC bus to the +DC switch in each of the plurality of switch pairs. The couplers include a bushing that is press fit into a hole in each of the bar conductors to which it is electrically coupled, to provide a close fit and a strong electrical connection for carrying high currents. When passing through other conductive layers positioned intermediate between the coupled conductors, an insulation ring is positioned tightly between the bushing and the intermediate conductive layer so that current cannot jump the gap between the bushing and the intermediate conductive layer, thereby electrically isloating the intermediate conductive layer.

In the described embodiment, the AC bar conductors are positioned on a first conductive plane, the −DC bar conductor is positioned on a second conductive plane, and the +DC bar conductor is positioned on a third conductive plane. A dielectric layer is positioned between each conductive plane. Particularly, a first dielectric layer is laminated between the +DC and −DC buses and a second dielectric layer is laminated between the −DC bus and the plurality of AC buses. Furthermore, the first conductive plane also includes a midpoint bus. A pair of resistors divide the DC voltage so that the midpoint bus maintains a voltage approximately midpoint between the +DC bus and the −DC bus. Each capacitor in the capacitor bank is connected to the midpoint bus and one of the +DC bus and the −DC bus. Therefore, each capacitor has only to hold off one-half of the total DC voltage, allowing use of less expensive capacitors with smaller voltage ratings.

The laminated bus assembly provides a strong structure that is durable and reliable, while conducting high current at high voltages. It can withstand vibration and shock, and even when wet provides good electrical connections. It is particularly useful in wind turbines that, once installed, are expensive to repair. The laminated bus assembly can support heavy loads: it has been implemented to support loads including the capacitor bank and heavy high power cables.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purpose, and therefore resort to the claims is necessary to determine the inventive subject matter.

DETAILED DESCRIPTION OF THE PREFERRED EMBODIMENT

FIGS. 1 through 6 of the drawings disclose various embodiments of the present invention for purposes of illustration only. One skilled in the art will readily recognize from the following discussion that alternative embodiments of the structures and methods illustrated herein may be employed without departing from the principles of the invention.

Figure 1A:
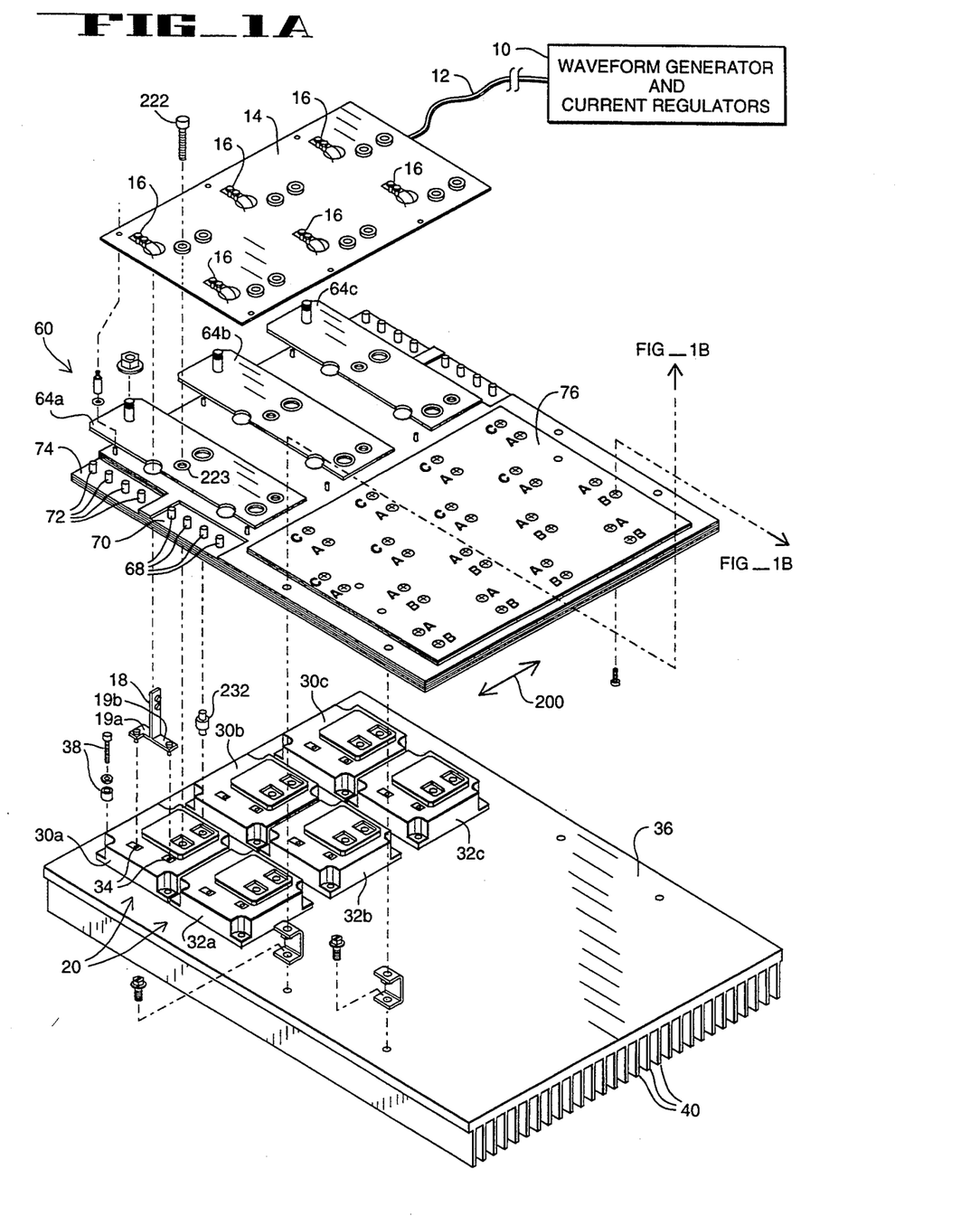
FIGS. 1A and 1B are perspective views of a gate control board, a laminated bus assembly, a switch pad, and a capacitor bank that are assembled to provide a converter.

Reference is first made to FIG. 1A which shows an exploded view of a converter including a laminated bus assembly 60. In a box 10, a waveform generator and current regulators are illustrated. Within the box 10, conventional computer equipment produces control signals for the converter in accordance with conventional pulse width modulation (PWM) techniques. The signals from the waveform generator and current regulators 10 are applied through a fiber optic cable 12 to a gate control board 14. The gate control board 14 includes conventional circuitry to convert these fiber optic signals to an electrical signal. This electrical signal is applied from a control output 16 to a gate bus 18. Although only one gate bus 18 is illustrated in FIG. 1A, it should be apparent that there will be one gate bus 18 for each of the six control outputs 16. The gate bus 18 is microstrip transmission line that has a first conductor 19a and a second conductor 19b with minimum spacing (0.001") therebetween for high immunity to noise.

The gate buses 18 connect the control outputs 16 with a plurality of switches 20, including a +DC switch 30a and a −DC switch 32a. As illustrated, the gate bus 18 is applied to control inputs 34 on the switch 30a. The first conductor 19a is connected to the gate of the switches, and the second conductor 19b is connected to the "K" connection of the switches, which is an absolute ground. In other embodiments, the number of conductors, and construction of the gate bus 18 can vary dependent upon the connections required by the switches that it controls. For example, in other embodiments the gate bus may comprise a cable with five conductors.

A gate bus is connected to each of the switches 30b, 30c, 32a–c. The switches 30 and 32 may comprise any of a plurality of fast semiconductor switches, includes IGBTs, bipolar transistors, or MOSFETs. In the preferred embodiment IGBTs are utilized. The switches 30 and 32 are positioned on a switchpad 36 by appropriate connecting hardware such as a screw, washer, and bushing 38. The switchpad 36 comprises a heat conductive material and a plurality of heat fins 40 positioned on a surface of the switchpad 36 to cool the switches 30a, 30b, 30c and 32a, 30b, 30c. The heat fins 40 may be exposed to cooling fluids such as wind in order to more effectively cool the switches.

Figure 4:
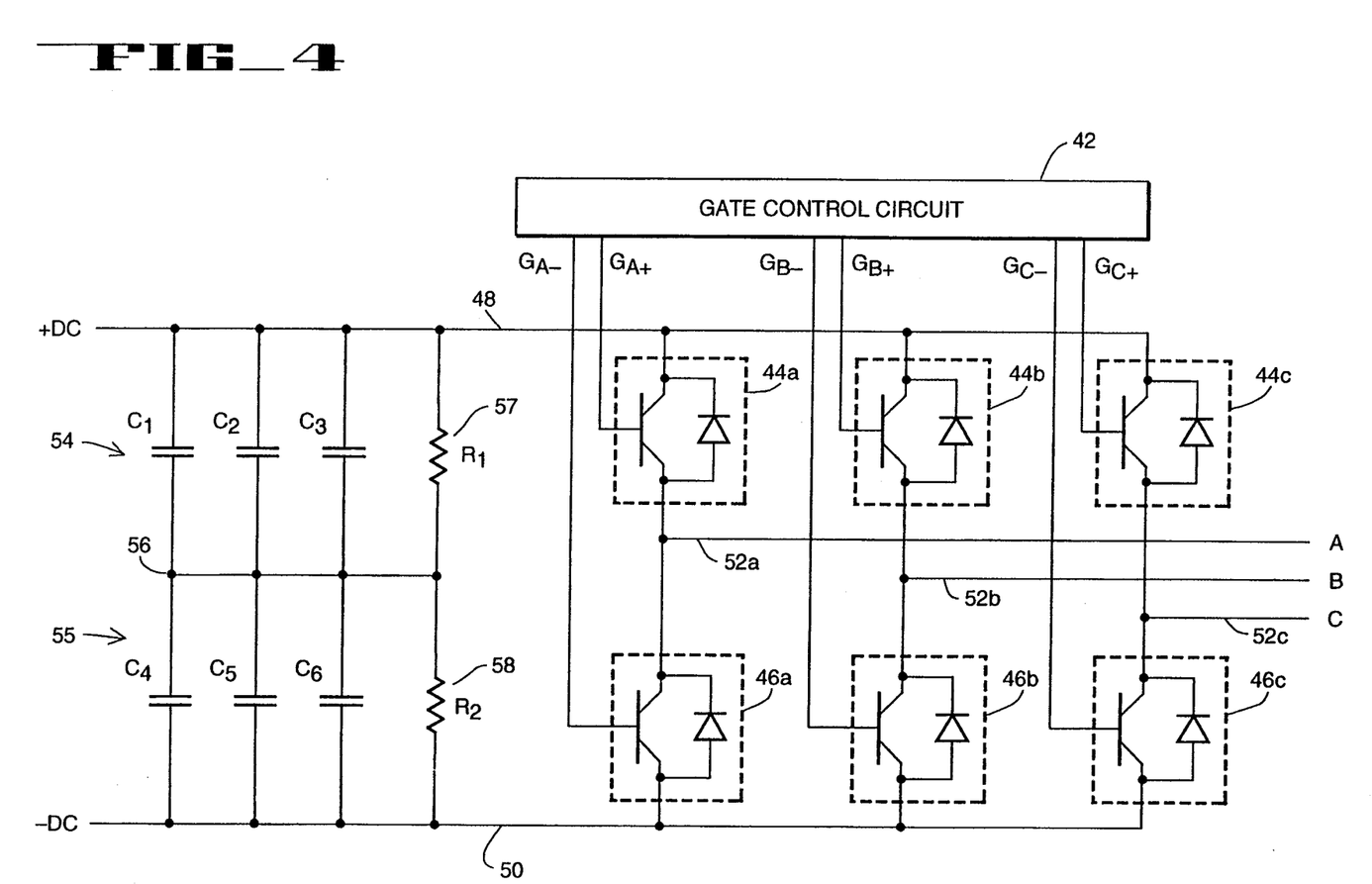
FIG. 4 is a schematic diagram of a switching converter, illustrating the switch pairs, the capacitor bank, the voltage splitting resistors, the gate control circuit, and the buses.

Reference is now made to the circuit diagram of FIG. 4 which is a schematic diagram of the circuit implemented in FIG. 1A. A gate control circuit 42 supplies signals to +DC switches 44 and −DC switches 46. The switches 44 and 46 are arranged in pairs between a +DC rail 48 and a −DC rail 50. Particularly, the switches 44a and 46a are positioned in series between the +DC rail 48 and the −DC rail 50. Intermediate between these two switches is a phase A output line 52a. The other switch pairs are in a similar configuration: the pair including switches 44b and 46b is positioned in series between the +DC rail 48 and the −DC rail 50 and a phase B output line 52b is coupled between these switches 44b and 46b, and the pair including switches 44c and 46c is in series between the +DC rail 48 and the −DC rail 50, and a phase C output line 52c is coupled between them.

A plurality of capacitors are also coupled between the +DC rail 48 and the −DC rail 50. The capacitors are divided into an upper row 54 including capacitor $C_1$, $C_2$ and $C_3$, and a lower row of capacitors 55 including capacitors $C_4$, $C_5$, $C_6$. The upper row 54 is in series with the lower row 55. The positioning of the capacitors in a series configuration is useful because, in the preferred embodiment, the peak voltage rating of the capacitors is less than the voltage across the +DC rail 48 and the −DC rail 50. Of course, other embodiments may have different requirements. The midpoint voltage of the capacitors appears on a node 56. The voltage at the midpoint 56 is controlled by resistor 57 and 58. Because each of the capacitors $C_1$ through $C_6$ have an identical rating, it is useful if the resistors 57 and 58 also have a substantially identical value so that the voltage is divided evenly between the upper row 54 and the lower row 55.

Figure 2:
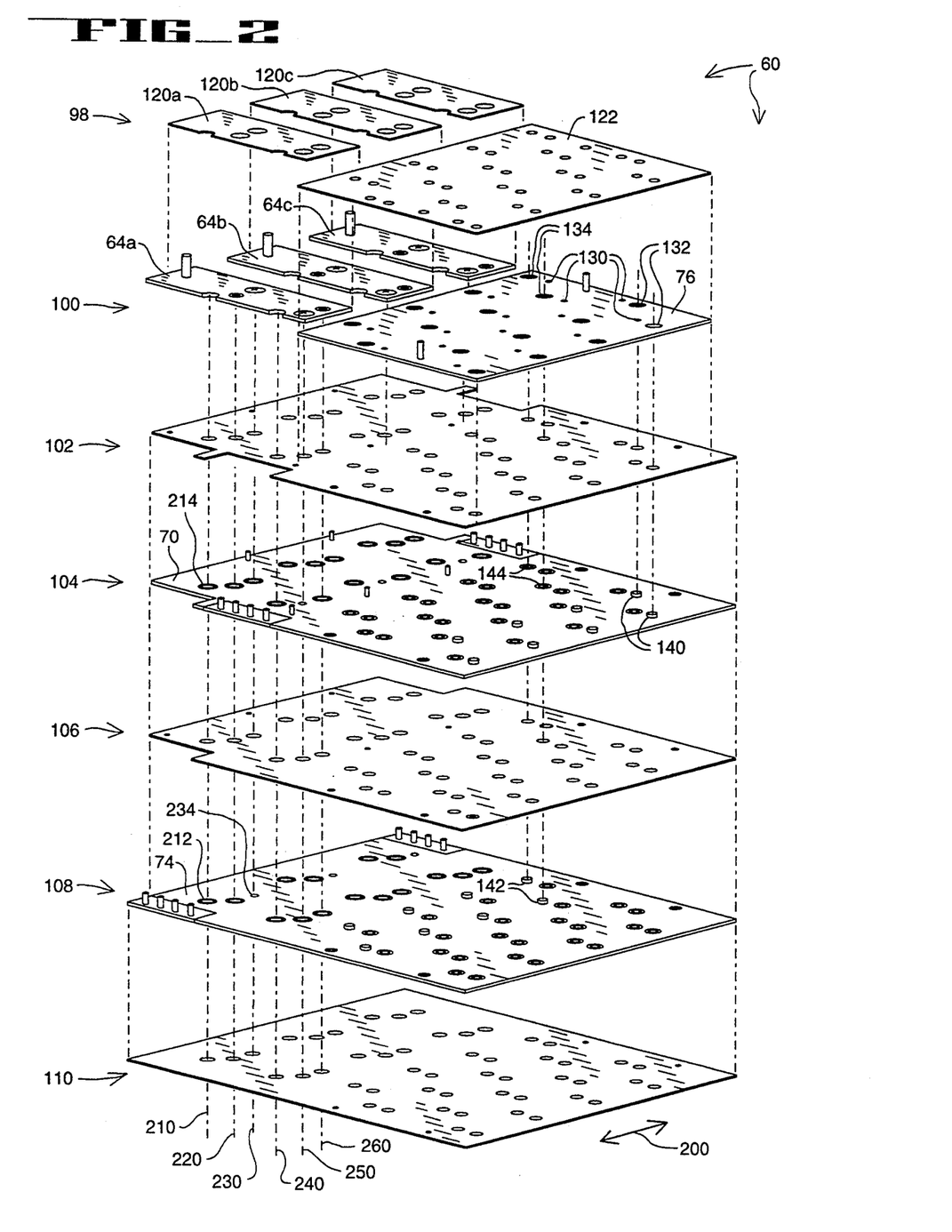
FIG. 2 is an exploded view of the laminated bus assembly.

Reference is now made to FIGS. 1A, FIG. 2, and FIG. 4. A laminated bus assembly 60 provides the bus connections to implement the circuit diagram illustrated in FIG. 4. The laminated bus assembly 60 includes a plurality of conductive layers alternating with dielectric layers to insulate them from each other. An upper conductive surface includes AC bar conductors 64a, 64b, and 64c, which respectively provide the output buses 52a, 52b, and 52c illustrated in FIG. 4.

A plurality of −DC output studs 68 are provided on a −DC bar conductor 70 that extends through the laminated bus assembly 60. A plurality of +DC output studs 72 are provided on a +DC bar conductor 74 that extends through the laminated bus assembly 60. The −DC bar conductor 70 corresponds to the −DC rail 50, and the +DC bar conductor 74 corresponds to the +DC rail 48 shown in the circuit diagram of FIG. 4. The +DC output studs 72 and the −DC output studs 68 are useful for external connections. For example, the output studs 68 and 72 can be connected, via a DC link, to another converter in a dual-converter configuration that is useful for converting variable frequency AC power to DC, and then converting the DC power to constant frequency AC power suitable for power grids. The dual-converter configuration is useful for power conversion in variable speed wind turbines.

Figure 1B:
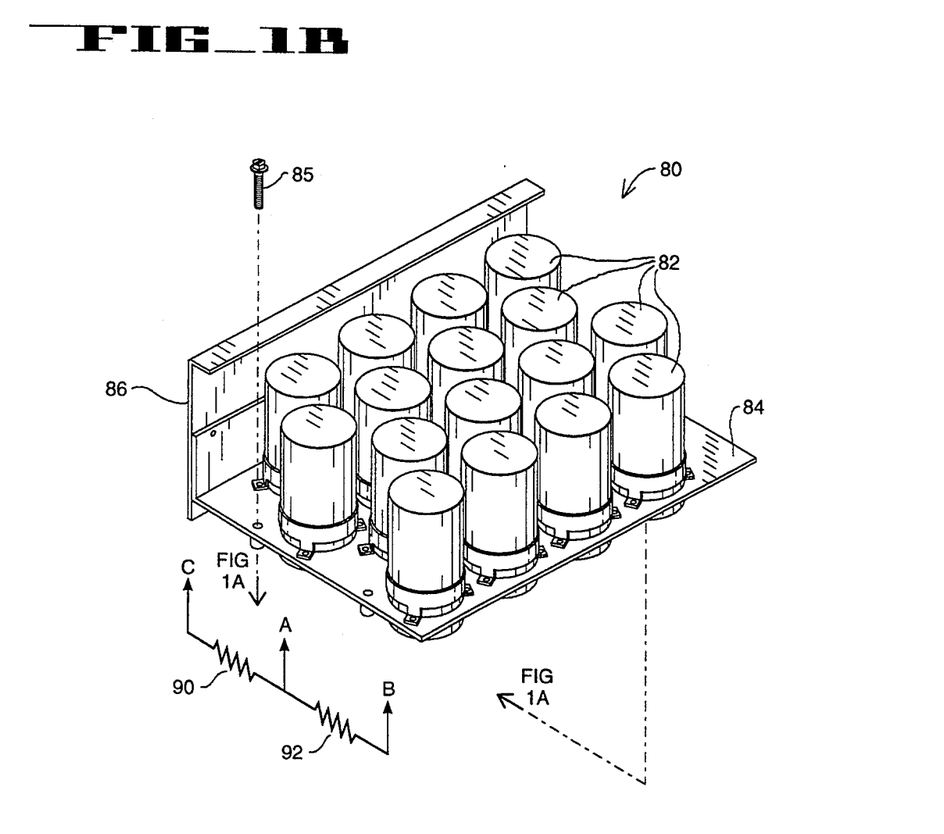

A midpoint bus 76 is also positioned on the laminated bus assembly 60. The midpoint bus 76 corresponds to the intermediate node 56 between the capacitors shown in the circuit diagram of FIG. 4. Reference is now made to FIG. 1B which is a perspective view of a capacitor bank 80 that connects with the laminated bus assembly 60 in FIG. 1A. The capacitor bank 80 includes a plurality of electrolytic capacitors 82 which correspond to the capacitors in the rows 54 and 56 of FIG. 4. In the preferred embodiment, as illustrated, there are 16 electrolytic capacitors 82, each having a maximum voltage rating of 450 volts. The capacitors 82 are arranged in eight parallel branches of two capacitors 82 in series between the −DC bar conductor 70 and the +DC bar conductor 74, so that the combined rating is within the 750–800 V range in the preferred embodiment. The capacitors 82 are mounted upon a mounting plate 84 and coupled to the laminated bus assembly 60 by conventional means such as a screw 85. An isolation plate 86 is positioned between the capacitors 82 and the AC bar conductors 64 in order to electrically isolate the capacitors from the AC bars 64 and eliminate arcing or interference. A resistor 90 illustrated in FIG. 1B is coupled between the connections marked "A" in FIG. 1A and those marked "C". The resistor 90 corresponds to the resistor 57 of FIG. 4. Furthermore, a resistor 92 is coupled between the "A" connection and the "B" connections of the midpoint bus 76 in FIG. 1A. The resistor 92 corresponds to the resistor 58 of FIG. 4. Preferably, the resistors 90, 92 have a similar value to approximately evenly divide the voltage.

Reference is again made to FIG. 2 which is an exploded view of a laminated bus assembly 60. The laminated bus assembly 60 may be divided into a plurality of planes of alternating conductor and dielectrics. Beginning at the top of FIG. 2, and working down, a cover plane 98 includes a plurality of plastic insulators to protect the metal surfaces to be described. A conductive plane 100 includes the AC bar conductor 64a–c, and the midpoint bus 76. A next dielectric layer 102 is positioned between the conductive plane 100 and a −DC conductive plane 104. The −DC bus 70 occupies the entire conductive plane 104. A dielectric layer 106 is positioned between the −DC conductive plane and a +DC conductive plane 108 which includes the +DC bar conductor 74. A lower plastic plane 110 is affixed on the underside of the +DC plane 108 in order to isolate it from the switches 20 and the switchpad 36.

The plane 98 includes a plastic piece 120a formed to cover the AC bar conductor 64a. Similarly, plastic pieces 120b and 120c have a shape to cover the AC bar conductor 64b and 64c. Likewise, a plastic piece 122 has a shape to cover the midpoint bus 76.

Figure 3:
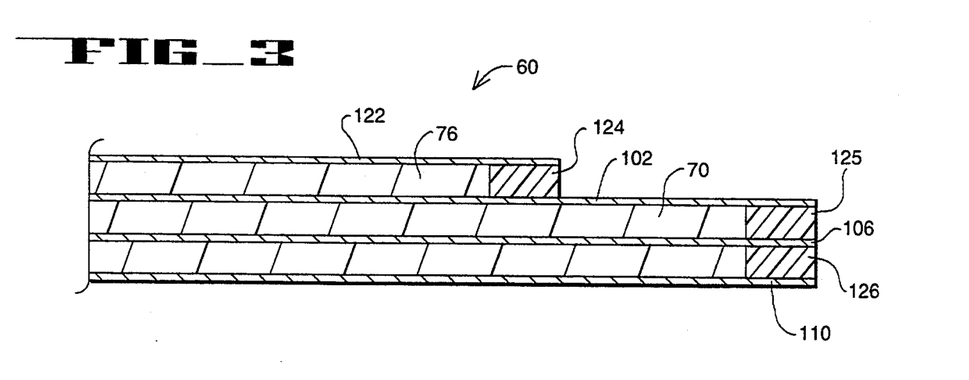
FIG. 3 is a cross-sectional view of edge fill in the laminated bus assembly.

Reference is now made to FIG. 2 and FIG. 3 to describe the manufacture of the laminated bus assembly 60. The bar conductors 64a, 64b, 64c, 70, and 74 are formed from aluminum sheet metal having a thickness for high current densities. The thickness can be within the range of 0.05 and 0.12 inches, preferably 0.093 inch. Holes are punched therein to provide the layout disclosed in FIG. 2 and discussed in more detail later herein. The conductors are then plated to prevent oxidation. The dielectric layers 102, 106, and 110 include a dielectric material such as "G-10" with a high dielectric constant. The thickness of the dielectric layers 102, 106, is comparable to that of the conductors, i.e., within the range of 0.05 and 0.12 inches. The dielectric layers 102, 106 are positioned between the bar conductors 64a, 64b, 64c, 70 and 74 and are bonded thereto by any suitable adhesive. With reference to FIG. 3, the edges are filled with an epoxy fill 124, 125, 126 to avoid exposed metal surfaces. Furthermore, all exposed metal is plated to prevent oxidation. The resulting laminated bus assembly 60 is very rugged, mechanically and electrically. The capacitors 82 affixed on it have a substantial weight, and furthermore heavy cables can be attached to it. Electrically, even if the resins break down, the unit would still be operable.

Each conductive and dielectric plane includes a plurality of holes having a predetermined shape and configuration. The midpoint bus 76 (see FIG. 1) includes a plurality of holes labeled "A", "B" and "C". Each of the capacitors 82 is connected to the midpoint bus 76 at holes 130 through the "A" connection. For illustrative purposes in the following description, only one set of holes will be numbered in the drawings. These holes are repeated through each row, and their position and use should be apparent. The "B" connection and the "C" connection to each capacitor 82 is made through a plurality of insulated holes 132 formed in the midpoint bus 76 to make the "B" connection with the −DC bus 70. The discussion with reference to FIGS. 5 and 6, below, discusses coupling through insulated holes. The midpoint bus 76 also includes a plurality of insulated holes 134 to facilitate the connection of the capacitors 82 with the +DC bus 74 in the conductive plane 108. On the −DC bus 70 and the conductive plane 104, a plurality of bushings 140 are inserted in holes provided thereon for this purpose. The bushings 140 extend through the dielectric plane 102 and connect to each capacitor 76 through the insulated holes 132 in the midpoint bus 76. Similarly, the +DC bus 74 in the conductive plane 108 includes a plurality of conductive bushings 142 positioned in holes provided thereon in a pattern to pass through the dielectric layer 106, the conductive layer 104, and the dielectric layer 102, and connect with the holes 134 formed in the midpoint bus 76. It should be apparent that the holes 134 have a diameter sufficient to engage with the bushings 142. It may be noted that the bushings 142 pass through insulated holes 144 formed in the conductive plane 104. When passing through a conductive plane, such as the conductive plane 104, bushings and insulator rings are utilized as described below to couple the two layers on either side of the conductive plane.

Figure 5:
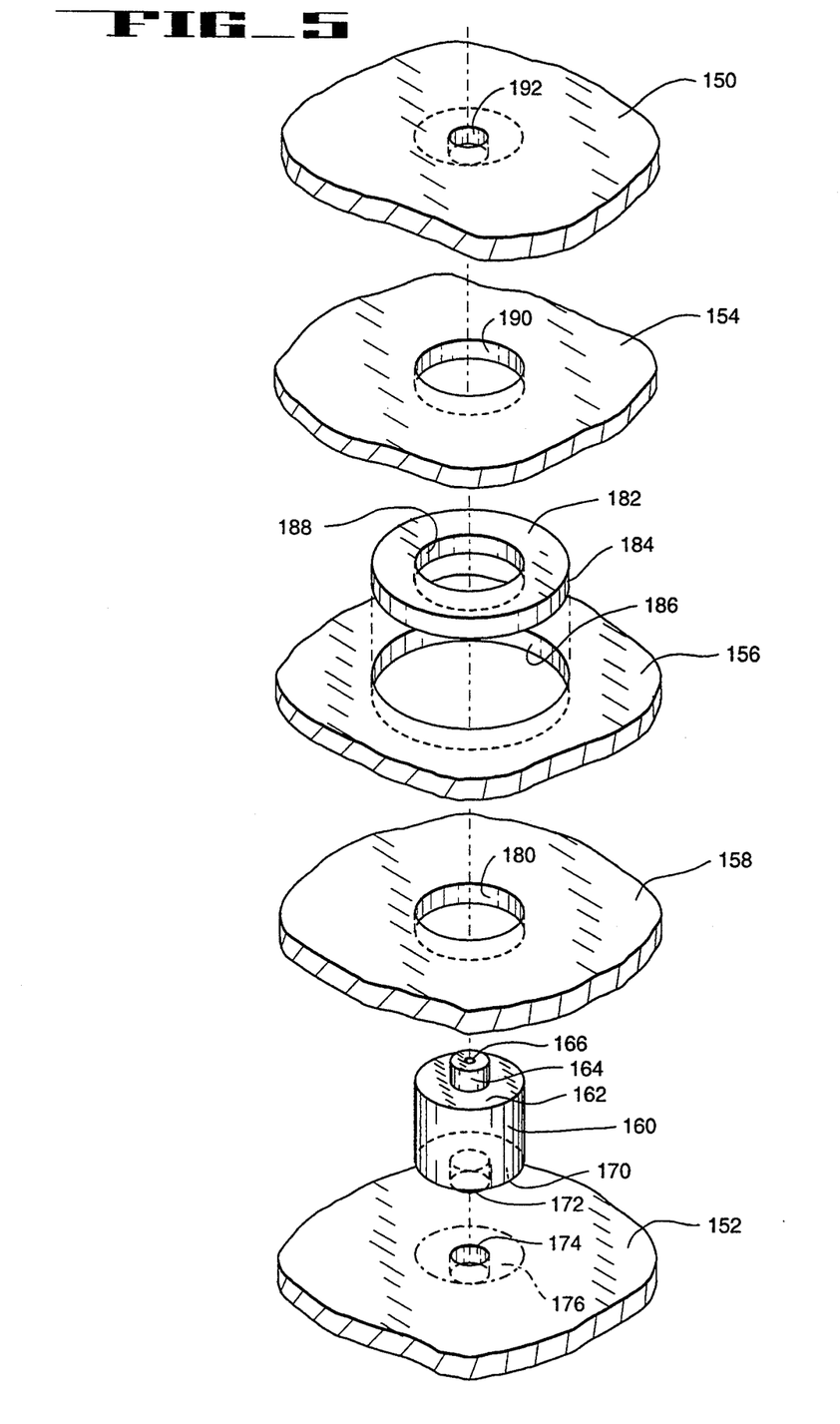
FIG. 5 is an exploded view of an electrical coupling between a first bar conductor and second bar conductor through a intermediate bar conductor and two dielectric layers.
Figure 6:
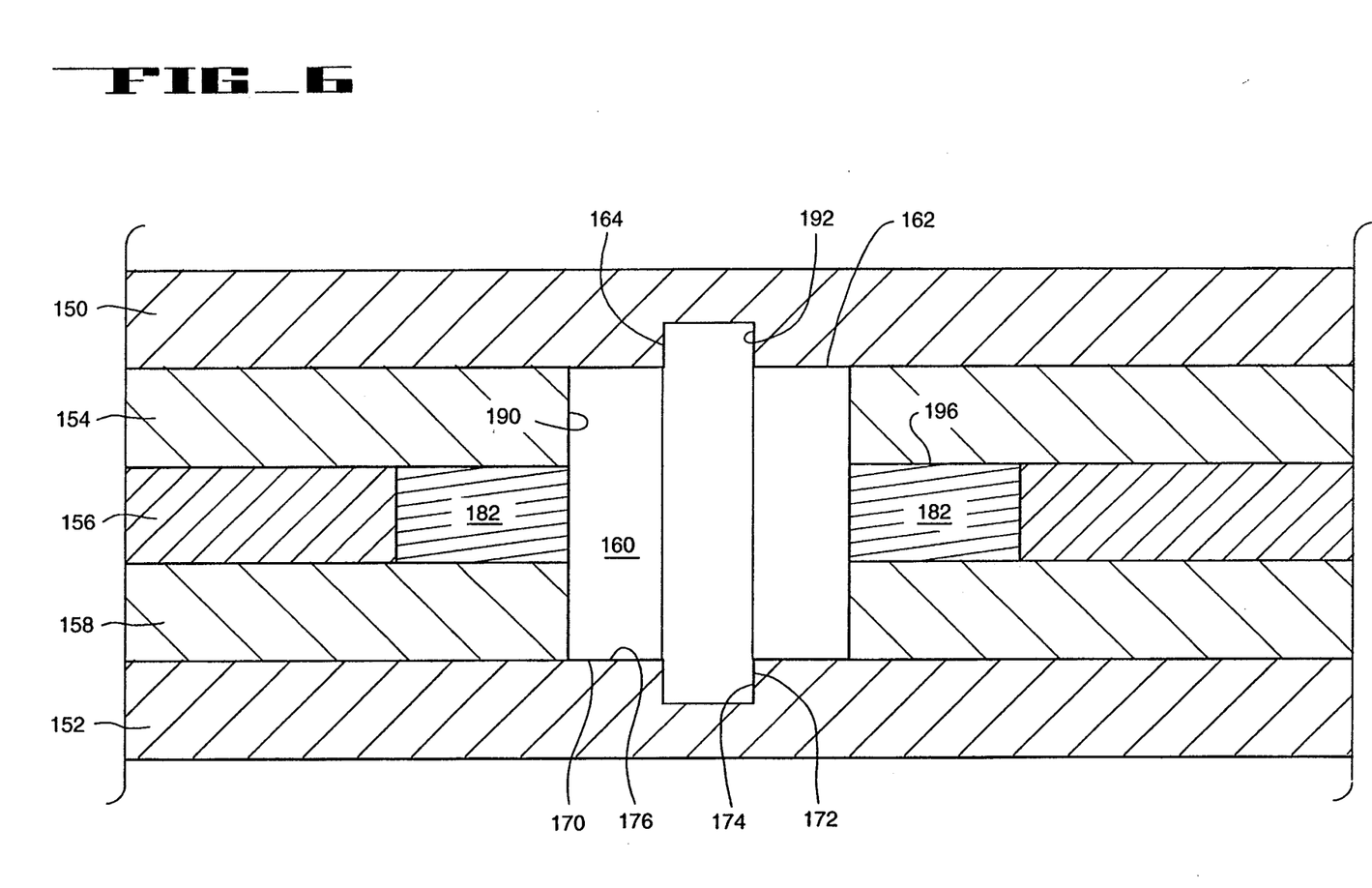
FIG. 6 is a cross-sectional view of an electrical coupling installed in the laminated bus assembly.

Reference is now made to FIGS. 5 and 6 which are perspective views of a coupling between a first conductive layer 150 and a second conductive layer 152, through a dielectric layer 154, an intermediate conductive layer 156, and a second dielectric layer 158. This coupling is designed to pass through the conductor 156 without arcing, even at high voltages. A bushing 160 conducts electrical current between the first conductive layer 150 and the second conductive layer 152. The bushing 160 has a cylindrical shape with an upper shoulder 162, an upper cylindrical plug 164, and an axial hole 166 provided therein having a size for inserting a bolt therethrough, for example to connect with a switch or a capacitor, or to provide mechanical support. The bushing 160 also includes a lower shoulder 170 and a lower cylindrical plug 172. A hole 174 in the conductive layer 152 is provided to engage with the lower cylindrical plug 172 in an interference fit. The ID/OD interference fit is controlled so that there is solid pressure contact. Therefore, when the bushing 160 is press fit into the hole 174, an electrical connection is made between the plug 172 and the surface of the hole 174, and also between the shoulder 170 and an area 176 surrounding the hole 174. Thus, the cross section for current flow is very large, which reduces current densities and the possibility of arcing. In the preferred embodiment, a current up to 325 amps can be conducted through this connection. Preferably, the bushing 160 is plated with electrolytic nickel.

The bushing 160 extends through a hole 180 formed in the second dielectric layer 158. To pass current in the bushing 160 through the conductive layer 156, an insulator ring 182 is utilized. The insulator ring 182 is formed, preferably, of a glass-epoxy material. The insulator can be made of any fiber or glass-filled resin. To avoid failure during operation, the material should not crack. Therefore pure resin should be avoided. Nylon or teflon should also be avoided because it cannot be bonded to the adjacent layer. It is useful to choose a material for the insulator ring 182 that can bond to the dielectric layer 154 as well as the conductive layer 156. An outside diameter 184 of the insulator ring 182 is positioned within a hole 186 formed within the intermediate conductive layer 156. An inner hole 188 of the insulator ring 182 has a shape to allow passage of the bushing 160. The bushing 160 then passes through a hole 190 formed in the first dielectric layer 154. The upper cylindrical plug 164 is then press fit within a hole 192 provided in the first conductive layer 150.

Reference is now made to FIG. 6 which is a cross-section of an assembled coupling which was shown exploded in FIG. 5. In the assembled view of FIG. 6, the bushing 160 is positioned within a portion of a laminated bus assembly 60. Specifically, the bushing 160 electrically couples the first conductive layer 150 with the second conductive layer 152. The insulator ring 182 prevents arcing between the bushing 160 and the conductive layer 156. During production, a thickness of the insulator ring 182 matches the thickness of the conductive layer 156 to within 0.001 inch. It is advantageous to have as close a fit as possible, in order to avoid arcing between the bush 160 and the conductive layer 156. This arcing could otherwise occur in the seam illustrated at 196. This electrical coupling has been tested to 3,000 V in prototypes without breakdown.

The following description will describe the layout of the laminated bus assembly 60 in the preferred embodiment. It will be apparent to one skilled in the art that other configurations may perform equivalently. For example, the layout of the holes in the midpoint bus 76 may vary in different embodiments. Reference is again made to FIG. 1A and FIG. 2. It will be seen that the layout is symmetrical along rows defined in a direction indicated by an arrow 200. As can be seen from FIG. 1A, the midpoint bus 76 has rows designated by the letter "B" alternating with rows designated by the letter "A". Also, the midpoint bus 76 has two rows designated by the letter "C" alternated with a row designated by the letter "A". These rows are designed to hold the sixteen dielectric capacitors 82 described elsewhere herein. Other embodiments that may use different capacitors with different ratings can use a different number of capacitors 82. All of the rows designated by the letter "A" terminate in the midpoint bus, to connect a capacitor with the midpoint bus 76. The "B" rows designate a connection with the −DC bus 70. For purposes of illustration, only two of the connections are shown. However, it will be apparent that for each of the rows, the connections are repeated. Furthermore, the "C" rows are all connected to the +DC bus 74. Likewise, the connections are repeated for each of the connections in that row.

The layout of the switches 20 is also symmetrical. It can be seen, from FIG. 1A, that the plurality of switches 20 are arranged in a +DC row that includes the +DC switches 30a,b,c, and a −DC row that includes −DC switches 32a,b,c. With reference to FIG. 2, the connections to the first phase of the switches is illustrated with dotted lines. It will be apparent to one skilled in the art that these connections are repeated for each of the other switches in the row. A first line 210 is the passageway for the gate control bus 18 illustrated in FIG. 1. Each of the holes, including the hole 212 and hole 214 are insulated by an insulator ring, such as illustrated with reference to FIGS. 5 and 6. Thus, the gate control bus 18 passes through the +DC bar connector 74 and the −DC bar conductor 70 without arcing. A second line 220 indicates the connection between the AC phase A bar conductor 64a and the switch 30a shown in FIG. 1. Again, the holes through the −DC bus 70 and the +DC bus 74 are insulated. A screw 222 (see FIG. 1A) passes through the gate control board 14 and a coupling 223 in the laminated bus assembly 60, and couples with an output connection 224 on the switch 30a. The coupling 223 is constructed in accordance with the coupling illustrated in FIGS. 5 and 6. This connection couples the AC bus bar conductor 64a with the switch 30a. A third line 230 illustrates the connection between the +DC bus bar and the switch 30A. Particularly, a bushing 232 (FIG. 1A) couples the switch 30a with the +DC bar conductor 74 at the hole 234.

Next, a fourth line 240 illustrates the passageway for a second gate bus from the gate control board 14 to control the −DC switch 32a. A fifth line 250 illustrates the connection between the −DC bar conductor 70 and the −DC switch 32a at a terminal 252. A bushing (not shown) is used to connect the terminal 252 with the −DC bar conductor 70 in accordance with the discussion with reference to FIGS. 5 and 6.

A sixth line 260 illustrates the passageway for connecting the phase A bar conductor 64a with the switch 32a. A screw such as described with reference to the line 220 is utilized to pass through each of the layers in the assembly 60 and connect to the −DC switch 32a.

From the above description, it will be apparent that the invention disclosed herein provides a novel and advantageous laminated, high power bus structure for a converter. The foregoing discussion discloses and describes exemplary methods and embodiments of the present invention. As will be understood by those familiar with the art, the invention may be embodied in other specific forms without departing from its spirit or essential characteristics, and thus, the described embodiment is not restrictive of the scope of the invention. The following claims are indicative of the scope of the invention. All variations which come within the meaning and range of equivalency of the claims are to be embraced within their scope.

What is claimed is:

1. A low impedance laminated bus assembly for a high power switched converter that has a plurality of switch pairs including a −DC switch and a +DC switch for high speed switching to convert between AC power on an AC power line that has a plurality of phases and DC energy storage device that has a +DC side and −DC side, said laminated bus assembly comprising:
    a first conductor plane having a plurality of AC bar conductors positioned thereon, including an AC bar conductor for each phase of AC power;
    a second conductor plane including a −DC bar conductor positioned thereon;
    a third conductor plane including a +DC bar conductor positioned thereon;
    a plurality of dielectric layers, each layer laminated between two of the first, second, and third planes;
    a −DC coupling means for coupling the −DC bar conductor to the −DC side of the DC power;
    a +DC coupling means for coupling the +DC bar conductor to the +DC side of the DC power;
    a +AC switch coupler for coupling each +AC bar conductor to a respective +DC switch in each of the plurality of switch pairs;
    a −AC switch coupler for coupling each −AC bar conductor to a respective −DC switch in each of the plurality of switch pairs;
    a first switch coupler for coupling the −DC bar conductors to the −DC switch in each of the plurality of switch pairs; and
    a second switch coupler for coupling the +DC bar conductor to the +DC switch in each of the plurality of switch pairs.

2. The laminated bus assembly of claim 1 further comprising a midpoint bar conductor, wherein the DC energy storage device includes a plurality of capacitors each having a first polarity connection and a second polarity connection, said capacitors including a first group of capacitors having their first connections coupled to the +DC bar conductor and their second connections coupled to the midpoint bar conductor, and a second group of capacitors having their first connections coupled to the −DC bar conductor and their second connections coupled to the midpoint bar conductor 3. A high power converter for converting electrical energy between a three-phase AC line and constant voltage Dc, said high power converter comprising:
    a DC energy storage means for storing electrical energy at a constant voltage, said DC energy storage means having a +DC side and a −DC side;
    a plurality of switch pairs for switching high power electrical energy, each switch pair including a +DC switch and a −DC switch coupled between the multi-phase AC and DC energy storage means, said switch pairs including a first switch pair for a first AC phase, a second switch pair for a second AC phase, and a third switch pair for a third AC phase;
    a switch control means coupled to the switch pairs for controlling the switch pairs to provide a predetermined electrical power flow in direction and amount; and
    a laminated bus assembly having
        a first conductor plane comprising a plurality of AC bus bars including a first AC bus bar coupled to the first AC phase, a second AC bus bar coupled to the second AC phase, and a third AC bus bar coupled to the third AC phase,
        a second conductor plane including a −DC bus bar,
        a first dielectric layer positioned between said plurality of AC bus bars and said −DC bus bar,
        a third conductor plane including a +DC bus bar,
        a second dielectric layer positioned between said plurality of AC bus bars and said +DC bus bar,
        a first AC coupler for coupling the first AC bus tot he first switch pair;
        a second AC coupler for coupling the second AC bus to the second switch pair;
        a third AC coupler for coupling the third AC bus to the third switch pair;
        a first −DC coupler for coupling the −DC bus to the −DC side of the DC energy storage means,
        a first switch coupler for coupling the −DC bus to the −DC switch in each of the plurality of switch pairs,
        a second −DC coupler for coupling the +DC bus to the +DC side of the DC energy storage means,
        a second switch coupler for coupling the +DC bus to the +DC switch in each of the plurality of switch pairs, and
        a plurality of dielectric layers including a first dielectric layer laminated between the +DC and −DC buses and a second dielectric layer laminated between the −DC bus and the plurality of AC buses.

4. The laminated bus assembly of claim 3 further comprising a midpoint bar conductor, wherein the DC energy storage device includes a plurality of capacitors each having a first polarity connection and a second polarity connection, said capacitors including a first group of capacitors having their first polarity connections coupled to the +DC bar conductor and their second polarity connections coupled to the midpoint bar conductor, and a second group of capacitors having their first polarity connections coupled to the −DC bar conductor and their second polarity connections coupled to the midpoint bar conductors.

* * * * *